United States Patent
Riebman et al.

[11] Patent Number: 5,231,078
[45] Date of Patent: Jul. 27, 1993

[54] THIN FILM SUPERCONDUCTING LC NETWORK

[75] Inventors: Leon Riebman, Rydal; Eitan Gertel, Lansdale, both of Pa.

[73] Assignee: AEL Defense Corp., Lansdale, Pa.

[21] Appl. No.: 755,264

[22] Filed: Sep. 5, 1991

[51] Int. Cl.$^5$ ............................ H03H 7/01; H01F 5/08
[52] U.S. Cl. ........................................ 505/1; 505/700;
505/701; 505/705; 505/866; 333/175; 333/185;
333/99.005
[58] Field of Search ............... 333/99 S, 219, 175,
333/185; 505/1, 700, 701, 705, 866

[56] References Cited

U.S. PATENT DOCUMENTS

| | | | |
|---|---|---|---|
| 2,584,592 | 2/1952 | Kehbel | 334/66 X |
| 3,413,716 | 12/1968 | Schwertz et al. | 29/602 |
| 3,668,581 | 6/1972 | Schrader | 335/216 |
| 3,701,958 | 10/1972 | Jaag | 333/185 |
| 4,016,519 | 4/1977 | Haas | 336/200 |
| 4,494,100 | 1/1985 | Stengel et al. | 336/200 |
| 4,591,814 | 5/1986 | Ito et al. | 333/185 X |
| 4,614,925 | 9/1986 | Kane | 333/174 |
| 4,926,292 | 5/1990 | Maple | 361/402 |
| 4,981,838 | 1/1991 | Whitehead | 333/995 X |
| 5,079,222 | 1/1992 | Yamazaki | 505/701 X |

FOREIGN PATENT DOCUMENTS

| | | | |
|---|---|---|---|
| 2577067 | 8/1986 | France | 333/185 |
| 189807 | 8/1987 | Japan | 333/185 |
| 1-64304A | 3/1989 | Japan | 336/DIG. 1 |
| 1-68905A | 3/1989 | Japan | 336/DIG. 1 |
| 1-68908A | 3/1989 | Japan | 336/DIG. 1 |
| 93007 | 4/1989 | Japan | 505/1 |

Primary Examiner—Robert J. Pascal
Assistant Examiner—Benny T. Lee
Attorney, Agent, or Firm—Seidel, Gonda, Lavorgna & Monaco

[57] ABSTRACT

A thin-film superconducting LC network comprising a dielectric substrate having first and second oppositely disposed surfaces, a first thin-film superconducting conductor on one of the surfaces defining an inductor, second and third thin-film superconducting conductors on said first and second surfaces, respectively, said second and third conductors opposing each other and having at least a portion of the dielectric substrate therebetween to form a capacitor, and thin-film superconducting conductor for interconnecting the inductor and capacitor to form a desired LC network. In one embodiment, the substrate between the second and third conductors have a thickness less than the thickness of the substrate between the first conductor and it oppositely disposed surface. In another embodiment, the inductor is defined by a plurality of closely spaced adjacent turns and a channel is disposed within the substrate between the adjacent turns.

15 Claims, 3 Drawing Sheets

THIN FILM SUPERCONDUCTING LC NETWORK

FIELD OF THE INVENTION

The present invention pertains to flat spiral inductors and associated capacitors formed from thin film superconducting material. In one particular form of the invention, the invention pertains to a high-Q lumped LC network for resonators, filters and the like.

BACKGROUND OF THE INVENTION

Superconductivity is a phenomenon occurring at very low temperatures in some materials, in which the electrons responsible for conduction undergo a collective transition to an ordered state, of which superconductivity is a characteristic. This ordered state exhibits several unique and remarkable properties: disappearance of resistance to the flow of electric current, appearance of a large diamagnetism and other unusual magnetic effects, substantial alteration of many thermal properties, and the occurrence of quantum effects otherwise observable only at the atomic and subatomic level. The temperature below which a material begins to exhibit superconductivity is called the transition temperature or "critical temperature," usually designated $T_c$. Below the critical temperature, electrical resistance of low-temperature superconductors drops sharply to levels at least $10^{12}$ times less than at normal temperatures. In high-temperature superconductors in the microwave and millimeter wave regions, the resistance drops sharply to levels on the order of $10^3$ to $10^4$ times less than at normal temperatures.

Other phenomena beside the disappearance of electrical resistance are displayed by superconductors. One of these is the Meissner-Ochsenfeld effect, in which an applied magnetic field is excluded from the interior of the superconductor. As long as the magnetic flux in a superconductor is low, the superconductor will remain completely superconducting in an applied magnetic field. If the magnetic field becomes too large, however, the superconductor will become partially or totally normal. That is, when the magnetic field exceeds a "critical field," designated $H_{c1}$, the superconductor reverts to the normal state and its resistance to electric current rises sharply.

Related to the Meissner-Ochsenfeld effect is the phenomenon of penetration depth. The way in which a superconductor excludes from its interior an applied magnetic field smaller than the critical field $H_{c1}$ is by establishing a persistent supercurrent on its surface and inside the material to the penetration depth which exactly cancels the applied field inside the superconductor. This current flows in a very thin layer of thickness $\lambda$, which is called the penetration depth. The external magnetic field also penetrates the superconductor within the penetration depth. Lambda depends on the material and on the temperature, and is typically very small, on the order of 1500 to 5000 Angstroms.

The existence of the critical field leads to another property of superconductors which is of importance. A supercurrent flowing in a superconductor will itself create a magnetic field, and this field will drive the superconductor normal at some critical value of the current, called the effective critical current. When the current in the superconductor exceeds the critical current density, the superconductor becomes normal and its resistance increases sharply.

The present invention is applicable to superconducting epitaxial thin films whose film thickness can be controlled up to at least a few depths of penetration of the superconducting material and can handle high current densities at temperatures below critical temperatures. Such thin films are usually deposited on substrates whose maximum size for uniform films is limited by the state of the art of film deposition and size of substrates or by cost, or both.

The invention pertains to optimizing the design of flat spiral inductances and, where desirable, of associated thin film capacitances utilizing the limited surface area available with superconducting thin films. Such films can handle currents up to 40 million amperes per square centimeter ($A/cm^2$). For a film thickness on the order of 2000 Angstroms, the line width needed for a superconductor to carry one Ampere would be approximately 12.5 microns (12.5 $\times 10^{-6}$ meters). This enables a large number of conductors to be placed in a small area.

By controlling line width and depth, flat spiral inductances can be optimized for maximum current handling or minimum losses. By controlling, i.e., reducing, the spacing between turns of the spiral, mutual coupling between turns, and therefore inductance, can be increased, albeit at the expense of lowering the spiral self-resonant frequency. However, closer spacing between turns increases field strength between turns, causes parasitic capacitance between turns and can cause voltage breakdown.

Another potential problem is that, whenever normal (i.e., non-superconducting) current leads are attached to a superconductor, especially a narrow line thin film superconductor, power delivered to the contact can cause localized heating of the superconductor and raise its temperature above the critical temperature. Connections between separate inductors and separate capacitors can also cause this problem.

SUMMARY OF THE INVENTION

The present invention is directed to a thin-film superconducting LC network comprising a dielectric substrate having first and second oppositely disposed surfaces, a first thin-film superconducting conductor on one of said surfaces defining an inductor, second and third thin-film superconducting conductors on said first and second surfaces, respectively, said second and third conductors having at least a portion of the dielectric substrate therebetween to form a capacitor, and thin-film superconducting conductor means for interconnecting the inductor and the capacitor to form a desired LC network.

In one of its embodiments, the invention comprises a high-Q lumped LC network comprising a dielectric substrate having first and second oppositely-disposed surfaces, at least a first thin-film superconducting conductor on one of said surfaces defining an inductor having a plurality of closely-spaced adjacent turns, wherein a portion of the substrate between adjacent turns is removed to define a channel between said turns, at least second and third thin-film superconducting conductors on said first and second surfaces, respectively, said second and third conductors having at least a portion of the dielectric substrate therebetween to form a capacitor, and thin-film superconducting conductor means for interconnecting the inductor and the capacitor to form a desired LC network.

DESCRIPTION OF THE DRAWINGS

For the purpose of illustrating the invention, there is shown in the drawings a form which is presently preferred; it being understood, however, that this invention is not limited to the precise arrangements shown.

DESCRIPTION OF THE INVENTION

Figure 1:
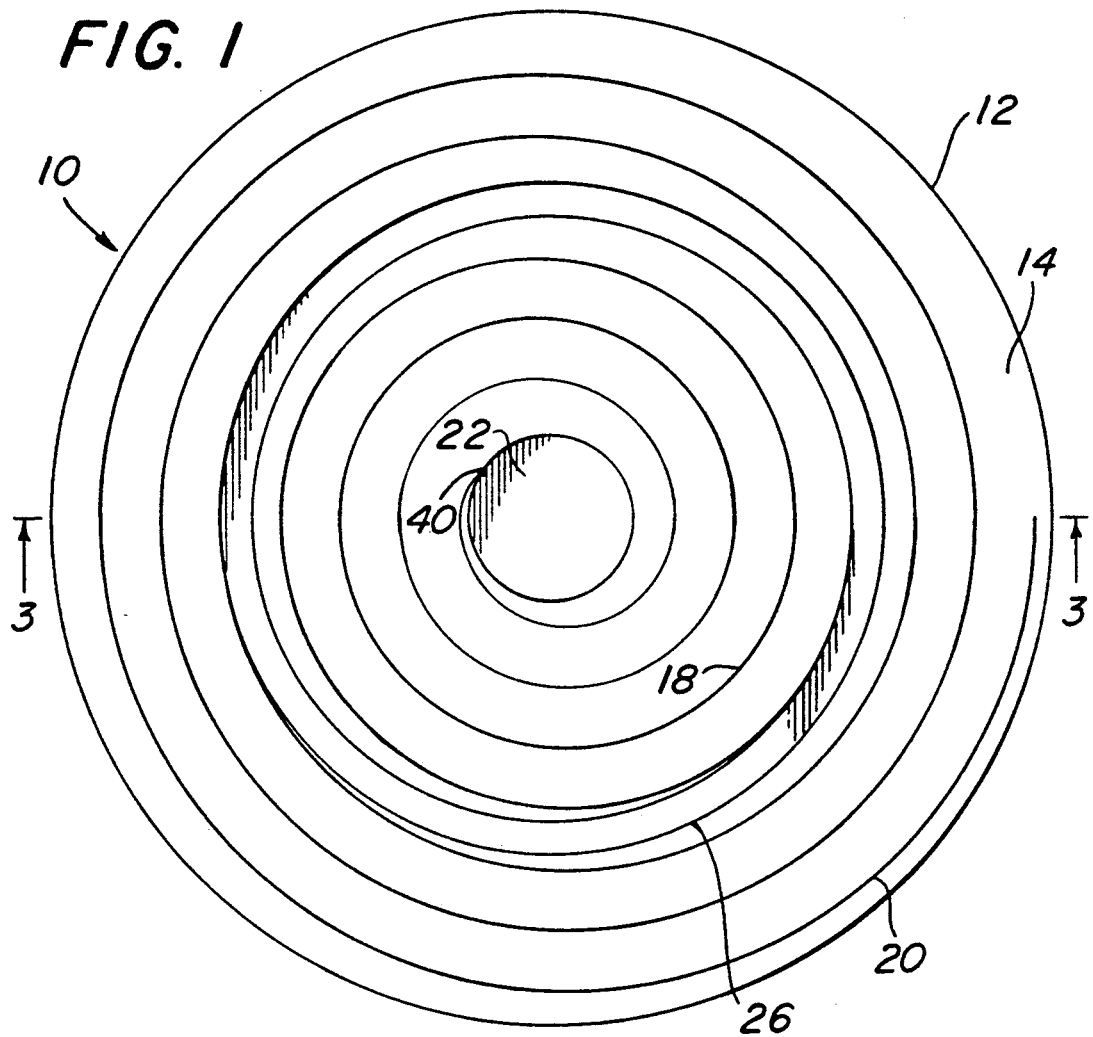
FIG. 1 is a simplified top plan view of an LC network according to the present invention.
Figure 2:
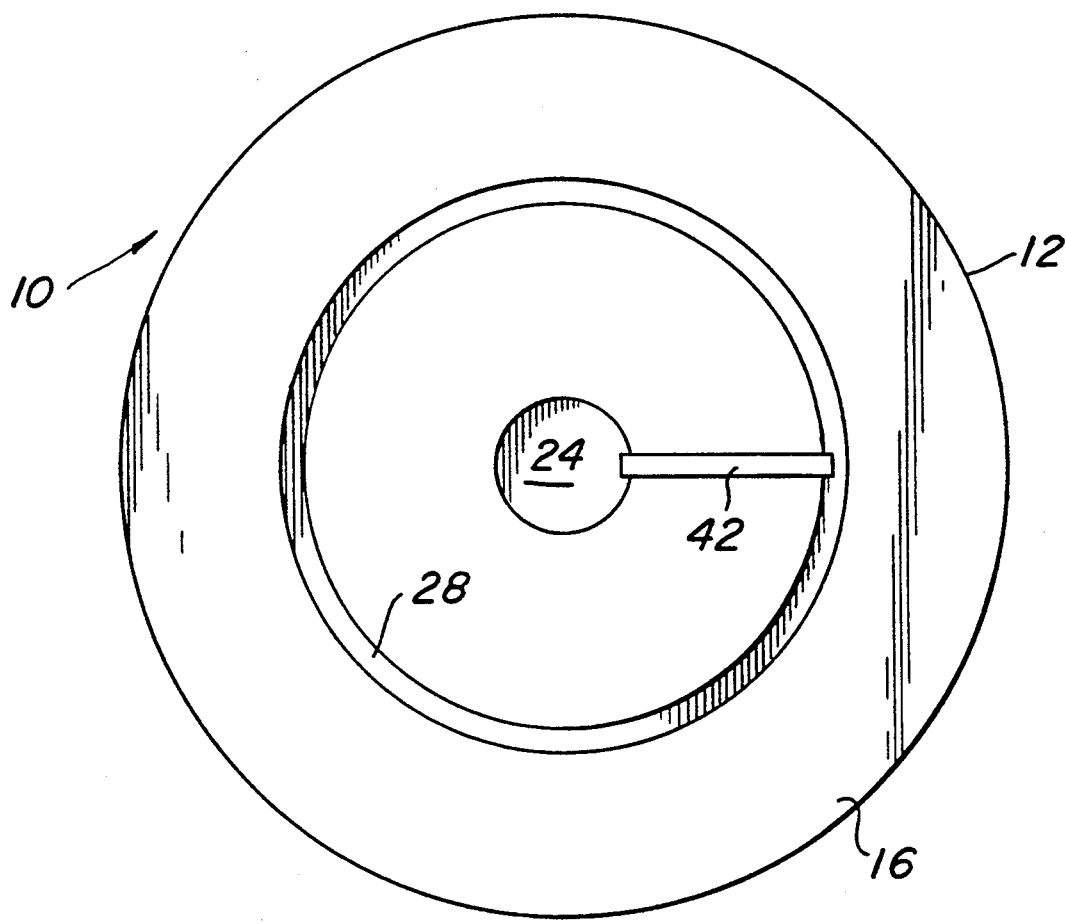
FIG. 2 is a simplified bottom plan view of the LC network of FIG. 1.
Figure 3:
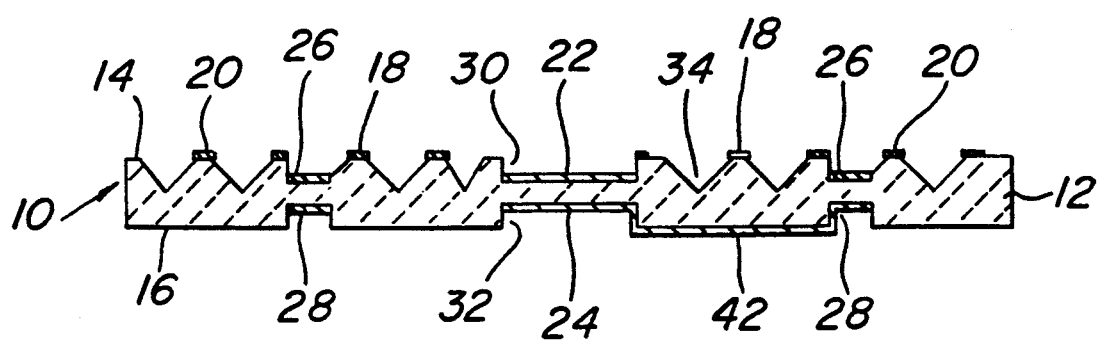
FIG. 3 is a sectional view of the LC network of FIG. 1, taken along the lines 3—3 in FIG. 1.

Referring now to the drawings, wherein like numerals indicate like elements, there is shown in FIGS. 1 through 3 a thin-film superconducting network 10 according to the invention. Network 10 comprises a substrate 12 of suitable dielectric material, such as a ceramic, e.g., alumina or other dielectric material with sufficient strength and requisite electrical properties. The particular dielectric material used is not crucial to the present invention. The substrate as shown in the figures is in the form of a circular disk, but the precise shape and form of the substrate is not critical.

Substrate 12 has first and second oppositely-disposed surfaces 14 and 16, respectively. For purposes of this disclosure, these surfaces may be thought of, and will occasionally be referred to, as top and bottom surfaces, respectively, although obviously the terms top and bottom are relative to the orientation of substrate 12. However, the orientation of substrate 12 and whether the first and second surfaces 14 and 16 are top and bottom, or left and right, is not crucial. Rather, the terms top and bottom are intended as a convenient shorthand reference to first and second surfaces 14 and 16, respectively.

As shown in FIGS. 1 and 3, top surface 14 has formed on it a thin-film superconducting conductor 18 which has a plurality of turns and defines a thin-film superconducting inductor. At least one inductor may be formed on top surface 14, although additional inductors, such as that formed by thin-film superconducting conductor 20 may also be adhered to top surface 14. The thin-film superconducting inductors may be formed by any suitable technique, such as chemical vapor deposition, plasma spraying or the like, without departing from the scope of the invention.

Also formed on top surface 14 is a second thin-film superconducting conductor 22, which defines on plate of a parallel-plate capacitor. As shown in FIGS. 2 and 3, a third thin-film super-conducting conductor 24 is formed on the bottom surface 16 of substrate 12 and defines the other plate of the capacitor. As best seen in FIG. 3, conductors 22 and 24 are of the same diameter and are in registry, and have at least a portion of substrate 12 between them to form a ceramic-dielectric parallel-plate capacitor. If desired, additional conductors 26 and 28 may be provided on top and bottom surfaces 14 and 16, respectively, to define an additional capacitor. The additional conductors 26 and 28 are in the form of annuli, or rings, and have the same centers and the same inner and outer diameters.

The number of inductors and capacitors that can be formed on substrate 12 is virtually without limit, and depends mainly on the diameter of the substrate and the dimensions of the conductors that can be formed on the surfaces thereof. As a practical matter, it can be said that any desired number of inductors and capacitors can be formed on substrate 12.

As those skilled in the art will know, capacitance is a function of the area of the parallel plates and the distance between the plates. Increasing the area of the plates, or decreasing the distance between them, increases the value of the capacitance. In practice, LC networks such as those contemplated by the invention tend to be quite small. For example, the diameter of substrate 12 is currently three inches in diameter, and may be an inch or even less. There is thus a practical and economical limit to the area of the plates of a capacitor formed on the substrate. Hence, it is difficult to increase capacitance by increasing the area of the plates.

This problem can be compensated for, in part, by decreasing the distance between the plates. Thus, referring to FIG. 3, it will be seen that substrate 12 is provided with recesses 30 and 32 in the top and bottom surfaces 14 and 16, respectively, in which conductors 22 and 24 are formed. This has the effect of reducing the spacing between the conductors 22 and 24. This technique thus serves to increase the capacitance of the capacitor formed by conductors 22 and 24. The capacitance can be varied, within obvious limits, by varying not only the area of the conductors 22 and 24, but also by varying the thickness of substrate 12 between the conductors.

Since the LC networks contemplated by the invention are expected to be quite small, another problem arises which could affect the performance of the network. Because of size limitations, in order to obtain a usable value of inductance from inductor 18, for example, several turns must be formed on the surface of the substrate. To fit the required number of turns in the limited area available, the turns need to be made very narrow and spaced very close together. However, as the turns are spaced more closely together, adjacent turns begin to capacitively couple together, creating unwanted parasitic capacitance between turns. The phenomenon of parasitic capacitance is a recurring problem in LC circuits of small size, as contemplated by the invention, and causes problems with circuit performance.

Figure 4:
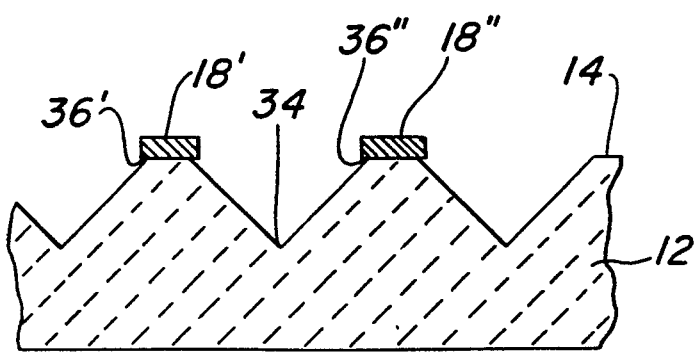
FIG. 4 is a partial sectional view of a portion of an LC network according to the invention, illustrating one form of structure for reducing parasitic capacitance between turns of the inductor of the LC network.

One way of reducing parasitic capacitance between turns is to space the coil turns farther apart. This is obviously impractical, however. A better way of reducing parasitic capacitance to a minimum optimized value is illustrated in FIG. 4. FIG. 4 is a partial sectional view of the LC circuit of FIGS. 1 through 3, and shows adjacent turns 18' and 18" of inductor 18 on substrate 12. As seen in FIG. 4, portions of substrate 12 between turns 18' and 18" have been removed to form vee-shaped grooves or channels 34 in top surface 14 of substrate 12. In addition, portions of substrate 12 beneath turns 18' and 18" on either side may be removed to further reduce parasitic capacitance between turns, leaving short undercut portions 36' and 36" at turns 18' and 18", respectively. The substrate material may be removed by chemical etching, for example, although the precise method of removing the material is not critical. By removing a portion of the substrate 12 between adjacent turns 18' and 18", the capacitive coupling between the turns is greatly reduced. Thus, by reducing the parasitic capacitance between inductor turns, it is possible to space the turns more closely together, reducing the amount of area required for the inductor and enabling its inductance to be increased.

Figure 5:
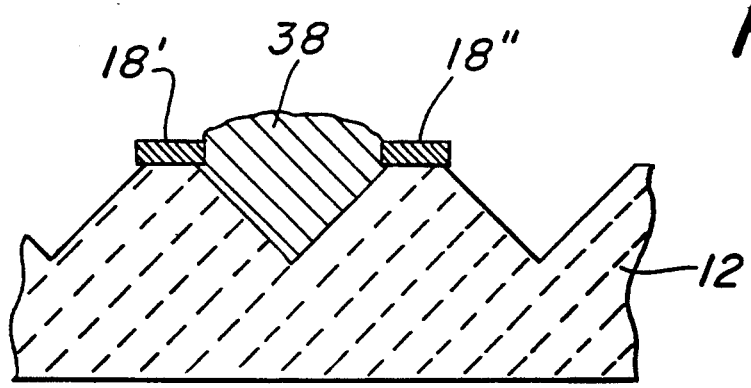
FIG. 5 is a partial sectional view similar to FIG. 4, showing a dielectric material deposited between turns of the inductor of the LC network.

As a further improvement illustrated in FIG. 5, the breakdown voltage between the turns can be increased by filling channel 34 of substrate 12 with a low-dielectric constant, low-loss, high-breakdown-strength material 38. Material 38 improves the voltage breakdown level between adjacent turns to a much higher level than would be the case with an air-gap dielectric as is formed by channel 34 alone. This permits the LC network to be used at very high power levels. Material 38 may be any suitable low-dielectric, low-loss, high-breakdown-strength material, and the particular material is not crucial to the invention. Likewise, channel 34 is illustrated as vee-shaped, but channel 34 may have any other shape, such as U-shaped or rectangular in cross-section, without departing from the invention.

It will be appreciated that the invention thus permits closer spacing of adjacent inductor turns with minimum optimized parasitic capacitance and with lower risk of voltage breakdown. In some cases, where substrate size is very large, a "stepped," or variable, spacing between inductor turns can be used in order to make maximum use of substrate area. Thus, inductor turns closer to the circumference of the substrate may be spaced more closely together than inductor turns closer to the center.

Of course, since the conductors are all made of a superconducting material, network 10 will be operated at cryogenic temperatures, according to known methods of cooling superconductors to temperatures below their critical temperature.

Figure 6:
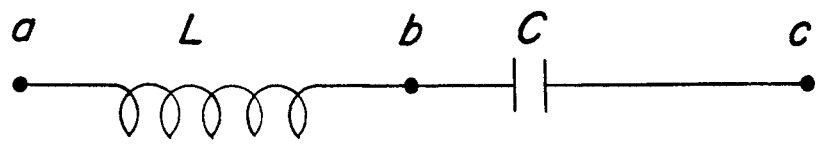
FIG. 6 is a schematic diagram of one type of LC network that can be realized with the present invention.
Figure 7:
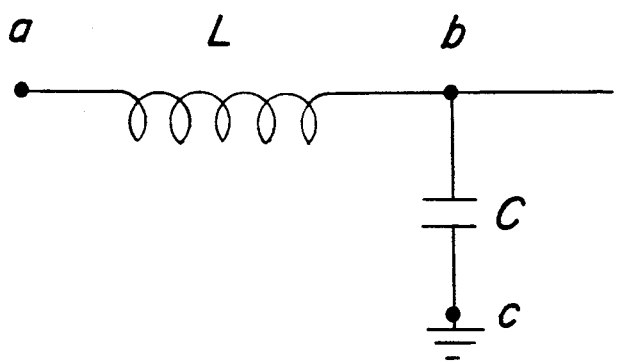
FIG. 7 is a schematic diagram of a second type of LC circuit that can be realized with the present invention.
Figure 8:
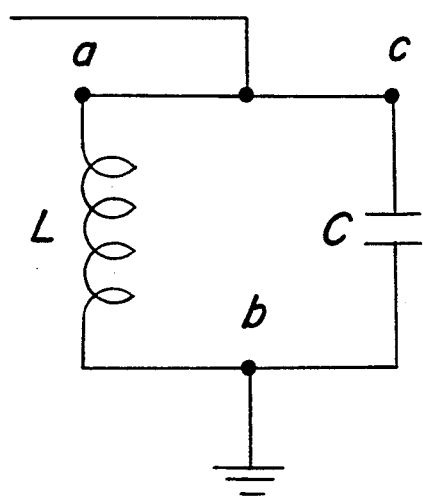
FIG. 8 is a schematic diagram of a third type of circuit that can be realized with the present invention.

The LC network of the present invention can be put to any number of practical uses, as shown in FIGS. 6 through 8. In those figures, a single capacitor and a single inductor are shown, but it is understood that the invention encompasses any number of inductors and capacitors. The inductor L with one terminal end a and capacitor C with one terminal end c may be connected in series as shown in FIG. 6, and as shown in FIG. 1, in which the inductor and capacitor are connected in series at common terminal end b by running the conductors together as shown. The inductor and capacitor may be connected as an LC low-pass network as shown in FIG. 7 by connecting the inductor L with one terminal end to one plate of the capacitor c, as at b, and by connecting the other plate of the capacitor to ground., as at c. The inductor with one terminal end and capacitor with one terminal end c may also be connected as a tank circuit as shown in FIG. 8 by connecting the inductor L and capacitor c at common terminal end b in parallel to ground. Those skilled in the art understand how the inductor and capacitor can be interconnected to obtain the network shown in FIG. 8. Those skilled in the art will appreciate that the present invention increases the capacitance of the capacitor. It also decreases parasitic capacitance, hence affecting the ability to increase inductance of the inductor. The virtually zero resistance at superconducting temperatures yield a tank circuit of very high Q. (As those skilled in the art will know, the Q, or quality factor, of an LC circuit is given by the relation $$Q = \frac{(L/C)^{\frac{1}{2}}}{R}$$

where R=resistance, L=inductance and C=capacitance. Thus, increasing inductance and capacitance while minimizing resistance will increase Q dramatically.)

In cases where a high power inductor is required, an optimum line width can be found for maximum utilization of the substrate area. Current density in the superconducting film is a function of the type of superconducting material, the thickness of the superconducting film, and the depth of penetration, and may be described as $$J(d) = J_c e^{-d/d_p} \quad (1)$$

where $J_c$ is the critical current density for the thin-film superconductor, d is the film thickness and $d_p$ is the depth of penetration. Hence, the maximum current that can be in a thin-film superconductor is $$I_{max} = c \cdot W \cdot d_p (1 - e^{-d/d_p}) \quad (2)$$

where $I_{max}$ is the maximum current and W is the width of the thin-film superconductor. If the superconducting film is very thick in comparison to $d_p$, i.e., $d \gg d_p$, then $$I_{max} = J_c \cdot W \cdot d_p \quad (3)$$

With these relationships, $H_{c1}$, the lowest level of magnetic field where the transition region begins, can be described as $$H_{c1} \approx \frac{I_{max}}{2(w + d)} \quad (4)$$

A constant, $\alpha$, can be defined for the particular superconductor material:

$$\alpha = \frac{2H_{c1}}{J_c d_p} \quad (5)$$

This constant is a function of the cryogenic temperature (which must be lower than $T_c$, the critical temperature) for a given superconducting material. It also varies from material to material at a given cryogenic temperature.

For $\alpha$ greater than one, $\alpha > 1$, the depth of penetration $d_p$ should be as great as possible, so that a minimum line width $W_o'$ can be defined for the superconducting film:

$$W_o' = \frac{I_{max}}{J_c d_p(1 - e^{-d_o/d_p})} \quad (6)$$

For $\alpha$ less than or equal to one, $\alpha \leq 1$, an optimum line width $W_o$ and optimum thickness $d_o$ can be defined:

$$d_o = d_p \log(1 - \alpha) \quad (7)$$

$$W_o = \frac{I_{max}}{J_c d_p(1 - e^{log(1-a)})} \quad (8)$$

Any depth greater than $d_o$ will reduce the maximum current that the inductor can handle, regardless of width. For $a > 1$, similar arguments hold for satisfying equation 6 at maximum depth.

Equations 6, 7 and 8 make it possible to achieve the maximum inductance with maximum Q for a given size or area of superconducting film. This enables the superconducting film to be made more easily and less expensively.

It will also be appreciated that the invention eliminates the need to interconnect superconducting conductors with normal (i.e., non-superconducting) leads. Instead, the interconnections between inductor 18 and the capacitor formed by conductors 22 and 24 are made using the same thin-film superconducting material from which the conductors themselves are fabricated. As seen in FIG. 1, conductor 22 is connected directly to conductor 18 at location 40, and preferably the connection is fabricated as an integral run of superconducting material in the conductor formation process. Likewise, in cases where more than one capacitor is formed, and there are therefore multiple conductors on the bottom surface 16, they may be interconnected by an integral run of superconducting material 42, as shown in FIGS. 2 and 3. This not only simplifies fabrication, it eliminates the disadvantages of using discrete, normal conductors to interconnect superconducting conductors.

The present invention may be embodied in other specific forms without departing from the spirit or essential attributes thereof and, accordingly, reference should be made to the appended claims, rather than to the foregoing specification, as indicating the scope of the invention.

I claim:

1. A thin-film superconducting LC network comprising
   (a) a dielectric substrate having first and second oppositely-disposed surfaces,
   (b) a first thin-film superconducting conductor disposed on one of said first and second surfaces defining an inductor, the substrate having a portion between said first conductor and said second oppositely-disposed surface, said portion having a first thickness,
   (c) second and third thin-film superconducting conductors disposed on said first and second surfaces, respectively, said second and third conductors opposing each other and having at least another portion of the dielectric substrate therebetween to realize a capacitor, the portion of the substrate between said second and third conductors having a second thickness less than said first thickness, and
   (d) thin-film superconducting conductor means for interconnecting the first conductor and a preselected one of the second and third conductors, thereby interconnecting the inductor and the capacitor to realize a desired LC network.

2. A thin-film superconducting LC network according to claim 1, wherein the means for interconnecting comprises superconducting material integral with said first conductor and said preselected one of the second and third conductors.

3. A thin-film superconducting LC network according to claim 1, wherein the first conductor comprises a flat spiral inductor having a plurality of spaced, adjacent turns.

4. A thin-film superconducting LC network according to claim 3, further comprising a channel within the substrate disposed between the adjacent turns of the inductor.

5. A high-Q lumped LC network comprising
   (a) a first dielectric substrate having first and second oppositely-disposed surfaces and having a first dielectric constant,
   (b) at least a first thin-film superconducting conductor disposed on one of said first and second surfaces defining an inductor having a plurality of closely-spaced adjacent turns,
   (c) at least second and third thin-film superconducting conductors disposed on said first and second surfaces, respectively, said second and third conductors opposing each other and having at least a portion of the dielectric substrate therebetween to realize a capacitor, and
   (d) thin-film superconducting conductor means for interconnecting the first conductor and a preselected one of the second and third conductors, thereby interconnecting the inductor and the capacitor to realize a desired LC network,
   (e) a channel within the substrate disposed between the adjacent turns of the inductor.

6. A network according to claim 5, wherein the channel includes a second dielectric substrate having a second dielectric constant.

7. A network according to claim 5, wherein the means for interconnecting comprises superconducting material integral with said first conductor and said preselected one of the second and third conductors.

8. A network according to claim 5, wherein the substrate has another portion between said first conductor and said second oppositely-disposed surface, said another portion having a first thickness, and the portion of the substrate between said second and third conductors having a second thickness less than said first thickness.

9. A network according to claim 5, wherein the first conductor comprises a flat spiral inductor having a plurality of spaced, adjacent turns.

10. A thin-film superconducting LC network comprising
    (a) a first dielectric substrate having first and second oppositely-disposed surfaces and having a first dielectric constant,
    (b) a first thin-film superconducting conductor disposed on one of said first and second surfaces defining an inductor, the inductor comprising a flat spiral inductor having a plurality of spaced, adjacent turns,
    (c) second and third thin-film superconducting conductors disposed on said first and second surfaces, respectively, said second and third conductors opposing each other and having at least a portion of the dielectric substrate therebetween to realize a capacitor, and
    (d) thin-film superconducting conductor means for interconnecting the first conductor and a preselected one of the second and third conductors, thereby interconnecting the inductor and the capacitor to realize a desired LC network, and
    (e) a channel within the substrate disposed between the adjacent turns of the flat spiral inductor.

11. A network according to claim 10, wherein the channel includes a second dielectric substrate having a second dielectric constant.

12. A thin-film superconducting LC network comprising
   (a) a dielectric substrate having first and second oppositely-disposed surfaces,
   (b) a plurality of first thin-film superconducting conductors disposed on one of said first and second surfaces defining a plurality of inductors, the substrate having a portion between said plurality of first conductors and said second oppositely-disposed surface, said portion having a first thickness,
   (c) a plurality of second and third thin-film superconducting conductors disposed on said first and second surfaces, respectively, corresponding ones of said plurality of second and third conductors opposing each other and having at least another portion of the dielectric substrate therebetween to realize a plurality of capacitors, the portion of the substrate between the corresponding ones of said plurality of second and third conductors having a second thickness less than said first thickness, and
   (d) thin-film superconducting conductor means for interconnecting the plurality of first conductors and preselected ones of the plurality of second and third conductors, thereby interconnecting the inductors and the capacitors to realize a desired LC network.

13. A thin-film superconducting LC network according to claim 12, wherein the plurality of first conductors comprise flat spiral inductors having a plurality of spaced, adjacent turns.

14. A thin-film superconducting LC network according to claim 13, further comprising a channel within the substrate disposed between the adjacent turns of said plurality of inductors.

15. A thin-film superconducting LC network according to claim 12, wherein the means for interconnecting comprises superconducting material integral with said plurality of first conductors and preselected ones of said plurality of second and third conductors.

* * * * *